US006785161B2

(12) United States Patent
Pekny

(10) Patent No.: US 6,785,161 B2
(45) Date of Patent: Aug. 31, 2004

(54) HIGH VOLTAGE REGULATOR FOR LOW VOLTAGE INTEGRATED CIRCUIT PROCESSES

(75) Inventor: Theodore T. Pekny, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/184,756

(22) Filed: Jun. 28, 2002

(65) Prior Publication Data

US 2004/0001357 A1 Jan. 1, 2004

(51) Int. Cl.[7] .............................................. G11C 16/00
(52) U.S. Cl. ........................... 365/185.18; 365/185.23; 365/189.11
(58) Field of Search ....................... 365/185.18, 185.23, 365/189.09, 189.11, 226

(56) References Cited

U.S. PATENT DOCUMENTS

| | | | |
|---|---|---|---|
| 5,260,646 A | 11/1993 | Ong | 323/349 |
| 5,592,421 A * | 1/1997 | Kaneko et al. | 365/189.09 |
| 6,009,034 A * | 12/1999 | Manning | 365/226 |
| 6,013,932 A | 1/2000 | Chevallier | 257/392 |
| 6,175,521 B1 * | 1/2001 | Pascucci et al. | 365/185.18 |
| 6,219,293 B1 | 4/2001 | Butler et al. | 365/226 |
| 6,285,600 B1 | 9/2001 | Mullarkey | 365/189.01 |
| 6,307,802 B1 | 10/2001 | Manning | 365/226 |
| 6,438,032 B1 | 8/2002 | Pekny et al. | 365/185.18 |
| 6,495,994 B1 | 12/2002 | Butler et al. | 323/273 |
| 6,512,412 B2 | 1/2003 | Casper | 327/538 |
| 6,563,339 B2 | 5/2003 | Pekny et al. | 326/33 |
| 6,584,030 B2 | 6/2003 | Marr | 365/226 |
| 2001/0040823 A1 | 11/2001 | Rooparvar | |
| 2001/0050576 A1 | 12/2001 | Gilliam | |
| 2003/0043677 A1 | 3/2003 | Marr | |
| 2003/0094997 A1 | 5/2003 | Blodgett et al. | |
| 2003/0107430 A1 | 6/2003 | Casper | |

* cited by examiner

Primary Examiner—Tan T. Nguyen
(74) Attorney, Agent, or Firm—Leffert Jay & Polgalze, P.A.

(57) ABSTRACT

An improved voltage reduction circuit and method is described that incorporates an independently controllable back bias voltage for increased gate/bulk fields in isolation well voltage reduction transistors that couple to and reduce external voltages that are too high for the integrated circuit process technology limits. The improved voltage reduction circuit and method allows for a higher overall available voltage and current flow for regulation by the circuit. Additionally, the improved voltage reduction circuit and method reduces voltage reduction circuit size by allowing for efficient implementation in a single isolation well. Furthermore, the improved voltage reduction circuit and method includes a back bias voltage control circuit that turns on and regulates the back bias voltage and avoids the problem of reverse bias conditions.

39 Claims, 9 Drawing Sheets ized circuit designer.

HIGH VOLTAGE REGULATOR FOR LOW VOLTAGE INTEGRATED CIRCUIT PROCESSES

TECHNICAL FIELD OF THE INVENTION

The present invention relates generally to integrated circuits and in particular the present invention relates high voltage regulators and voltage reduction circuits utilized in low voltage integrated circuits.

BACKGROUND OF THE INVENTION

Most integrated circuits and memory devices are designed to operate using a specific voltage power supply, such as 5V±10%, that their internal process technologies are designed to tolerate. In modem integrated circuits and memories, the need for higher voltage power supplies is reduced as the process feature sizes, such as transistors, are reduced and operating speeds increase. However, in many situations the externally supplied high voltage is fixed by past usage, convention, or industry specification and is unable to be easily reduced to for the lower voltage tolerant process technologies.

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks". Each of the cells within an erase block can be electrically programmed in a random basis by charging the floating gate. The charge can be removed from the floating gate by a block erase operation, wherein all floating gate memory cells in the erase block are erased in a single operation. For ease of access and management the erase blocks of a non-volatile memory device are typically arranged in "banks" or segments.

Both RAM and ROM random access memory devices have memory cells that are typically arranged in an array of rows and columns. During operation, a row (page) is accessed and then memory cells can be randomly accessed on the page by providing column addresses. FIG. 1 shows a simplified diagram of a system 128 incorporating a Flash memory 100 of the prior art coupled to a processing device or controller 102. The Flash memory 100 has an address interface 104, a control interface 106, and a data interface 108 that are each coupled to the processing device 102 to allow memory read and write accesses. Internally to the Flash memory device a control state machine 110 directs internal operation of the Flash memory device; managing the Flash memory array 112 and updating RAM control registers and non-volatile erase block management registers 114. The RAM control registers and tables 114 are utilized by the control state machine 110 during operation of the Flash memory 100. The Flash memory array 112 contains a sequence of memory banks or segments 116. Each bank 116 is organized logically into a series of erase blocks (not shown). Memory access addresses are received on the address interface 104 of the Flash memory 100 and divided into a row and column address portions. On a read access the row address is latched and decoded by row decode circuit 120, which selects and activates a row page (not shown) of memory cells across a selected memory bank. The bit values encoded in the output of the selected row of memory cells are coupled from a local bitline (not shown) to a global bitline (not shown) and detected by sense amplifiers 122 associated with the memory bank. The column address of the access is latched and decoded by the column decode circuit 124. The output of the column decode circuit selects the desired column data from the sense amplifier outputs and coupled to the data buffer 126 for transfer from the memory device through the data interface 108. On a write access the row decode circuit 120 selects the row page and column decode circuit selects write sense amplifiers 122. In programming a Flash memory, a charge pump circuit 130 is first activated to provide a higher programming voltage to the floating gate memory cells of the memory array 112 than the voltage supplied to operate the memory 100. Data values to be written are coupled from the data buffer 126 to the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

Many Flash memories support fast or "factory" programming wherein the Flash memory is rapidly programmed with data. Instead of the internal charge pump, the factory programming mode typically utilizes an exterior high voltage power source that is more capable of supplying the power and current demanded in rapid programming. This external high voltage input is typically reduced and regulated for internal use by a regulator circuit the Flash memory. In addition to Flash memories, many other integrated circuits and memories utilize such an external high voltage input and regulator for internal operations. A problem with external high voltage input in integrated circuits is that the modern process technologies are in many cases unable to tolerate the field or voltage level of the external high voltage input. Additionally, as stated above, in many situations the externally supplied high voltage is fixed by past usage, convention, or industry specification and cannot be easily altered by the integrated circuit designer.

One such manner of operating a voltage regulator off an input voltage that is higher than the process breakdown voltage level is by the utilization of a voltage reduction circuit which utilizes what is termed "back bias". In voltage reduction circuits utilizing back bias, an input MOS transistor(s) that is coupled to the external input voltage is formed in one or more separate isolation wells, isolated from the rest of the integrated circuit. Isolation wells are electrically isolated wells created by forming a well of oppositely doped silicon in the bulk material that, in turn, contains an area of silicon that is doped the same as the bulk, (i.e., a N-doped well in a P-doped bulk, containing a P-doped well material) creating an inherent reversed biased PN diode junction that isolates the circuits formed in the well. The input transistors are "diode connected" with the gate coupled to the drain so that they operate as a two terminal device in the threshold region and drop a threshold value of voltage potential. The bulk material inside the isolation wells is coupled to the source of the input transistor(s) so that the voltage across the transistor(s) of the voltage reduction circuit formed in the isolation well(s) is generally only a threshold drop and well within the process limits of the transistor(s). One or more voltage reduction transistors in on or more isolation wells can be serially coupled to produce a larger voltage reduction. In this manner existing process steps can be utilized to handle an external input voltage that is higher than the process technology limits are without additional special or expensive process steps.

Voltage reduction circuits that utilize drain coupled back bias can suffer from reduced current flow because of the limited voltage available for generating the conducting carrier channel in the MOS transistor. With source coupled back bias only a threshold drop of potential is applied to the gate/bulk of the transistor to generate the conduction channel. This can restrict the final voltage and current flow available to be utilized and/or regulated by the integrated circuit. Also, the application of a rigidly fixed back bias cannot easily be adjusted for circuit needs and input voltages and/or reduce the available voltage for regulation. An additional problem can be the size requirements of a voltage reduction circuit with multiple isolation wells. A further issue is the possibility of a reverse bias condition when the external voltage input is pulled to ground and a voltage is being applied to the isolation well through the back bias/voltage regulator connection. In this situation it is possible for the inherent PN diode junctions of the MOS transistor's source/drain to forward bias and source current into the grounded external voltage connection.

For the reasons stated above, and for other reasons stated below which will become apparent to those skilled in the art upon reading and understanding the present specification, that there is a need in the art for an improved voltage reduction circuit and voltage regulator for low voltage process integrated circuits and memories.

SUMMARY OF THE INVENTION

The above-mentioned problems with high voltage reduction and regulation for low voltage process integrated circuits and memories are addressed by the present invention and will be understood by reading and studying the following specification.

In one embodiment, a voltage reduction circuit comprises an isolation well containing one or more serially coupled metal oxide semiconductor (MOS) transistors, wherein each MOS transistor has its gate coupled to its drain to operate in diode coupled mode and wherein a first MOS transistor of the one or more serially coupled MOS transistors is coupled to an external voltage input, and a back bias control circuit to apply a back bias voltage to the isolation well.

In another embodiment, a voltage regulator circuit comprises a voltage reduction circuit coupled to an external input, a back bias control circuit coupled to the voltage reduction circuit, and a voltage regulation circuit coupled to the voltage reduction circuit.

In yet another embodiment, a back bias control circuit comprises one or more serially coupled input resistors, wherein each input resistor is formed in an isolation well and wherein a first input resistor is coupled to an external voltage input, one or more serially coupled output resistors, wherein each output resistor is formed in an isolation well and a final output resistor is coupled to a lower power rail, and a schmitt trigger coupled to a final input resistor of the one or more serially coupled input resistors and to a first output resistor of the one or more serially coupled output resistors, wherein the schmitt trigger selectively enables and disables at a predetermined voltage threshold value of the external voltage input.

In a further embodiment, a Flash memory device comprises a memory array containing a plurality of floating gate memory cells, an address interface coupled to a row address decoder and a column address decoder, a control circuit coupled to the memory array and the address interface, and a voltage regulator circuit, wherein the voltage regulator circuit is coupled an external voltage input and the memory array and is adapted to provide a programming current and a programming voltage when the Flash memory device operates in fast programming mode and wherein the voltage regulator circuit comprises a voltage reduction circuit, a back bias control circuit, and a voltage regulation circuit.

In yet a further embodiment, a system comprises a processor, and a Flash memory device coupled to the processor, wherein the Flash memory device comprises a memory array containing a plurality of floating gate memory cells, an address interface coupled to a row address decoder and a column address decoder, a control circuit coupled to the memory array and the address interface, and a voltage regulator circuit, wherein the voltage regulator circuit is coupled an external voltage input and the memory array and is adapted to provide a programming current and a programming voltage when the Flash memory device operates in fast programming mode and wherein the voltage regulator circuit comprises a voltage reduction circuit a back bias control circuit, and a voltage regulation circuit.

In another embodiment, an integrated circuit comprises a voltage reduction circuit coupled to an external input, a back bias control circuit coupled to the voltage reduction circuit, and a voltage regulation circuit coupled to the voltage reduction circuit.

In yet another embodiment, a method of operating a voltage reduction circuit comprises receiving an external voltage at an integrated circuit, applying an optimal back bias voltage to a voltage reduction circuit that is formed in an isolation well when the external voltage reaches a predetermined threshold value, and reducing the external voltage with the voltage reduction circuit.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

To deal with the above detailed issues of problems with high voltage regulation for integrated circuits and memories with low voltage processes, embodiments of the present invention utilize an improved voltage reduction circuit that applies an optimal, separately generated, back bias voltage to the isolation well of the voltage reduction circuit, increasing the voltage available to generate conduction channels in the MOS transistors and resulting in increased voltage available to regulated and increased current flow. Embodiments of the present invention also allow all reduction transistors to share a common isolation well, reducing overall circuit size. Integrated circuits incorporating embodiments of the present invention allow for high voltage external inputs to be utilized with low voltage process technologies. Additionally, memories incorporating embodiments of the present invention allow for use of low voltage process technologies with legacy factory fast programming supply voltages.

An example of voltage reduction circuits with back bias are described in the U.S. Pat. No. 6,013,932, filed Jan. 7, 1998, titled "Supply Voltage Reduction Circuit For Integrated Circuit" by Christopher J. Chevallier, which is commonly assigned and is incorporated herein by reference.

Figure 1:
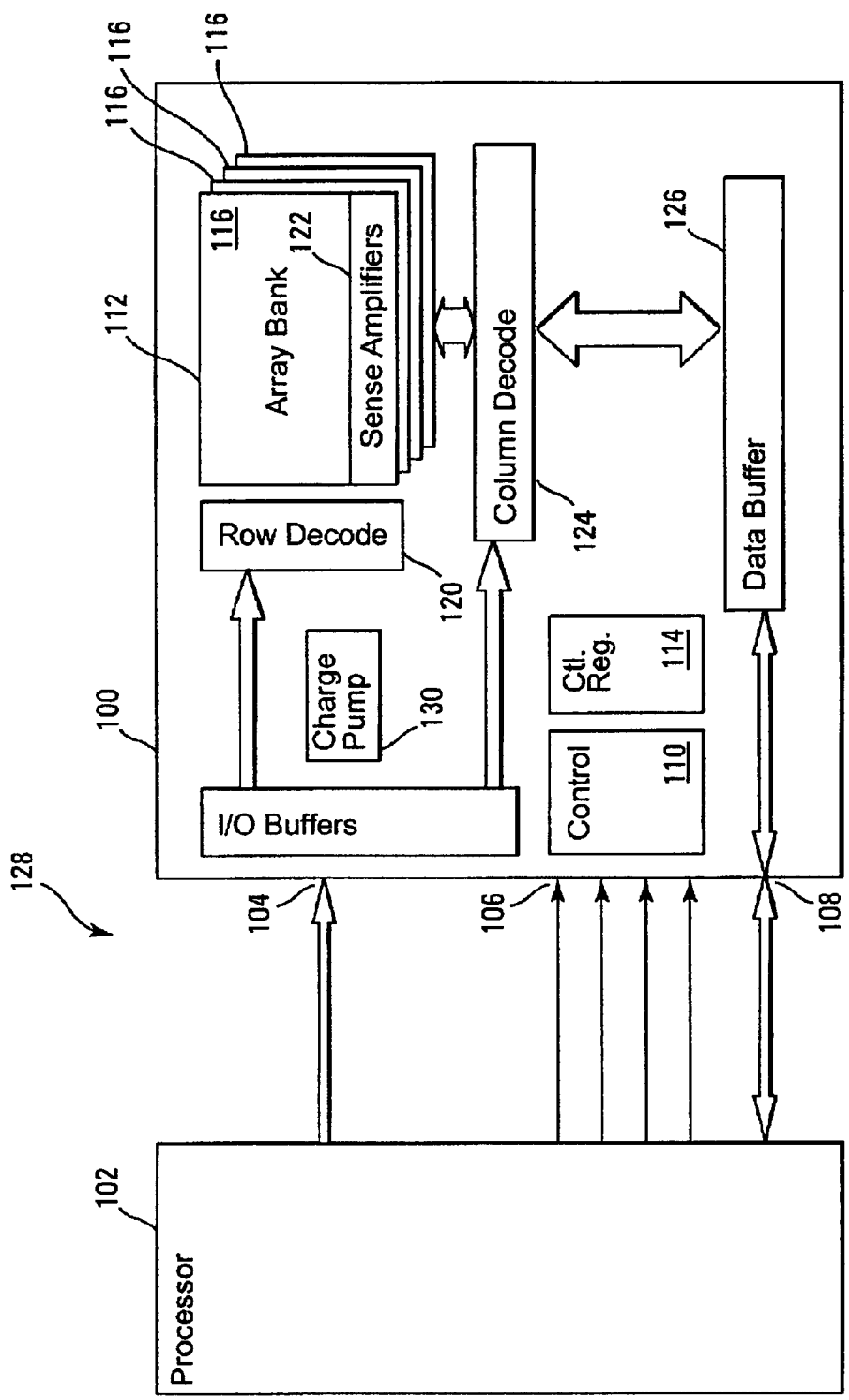
FIG. 1 is a simplified diagram of a system incorporating a processor and a Flash memory device of the prior art.
Figure 2:
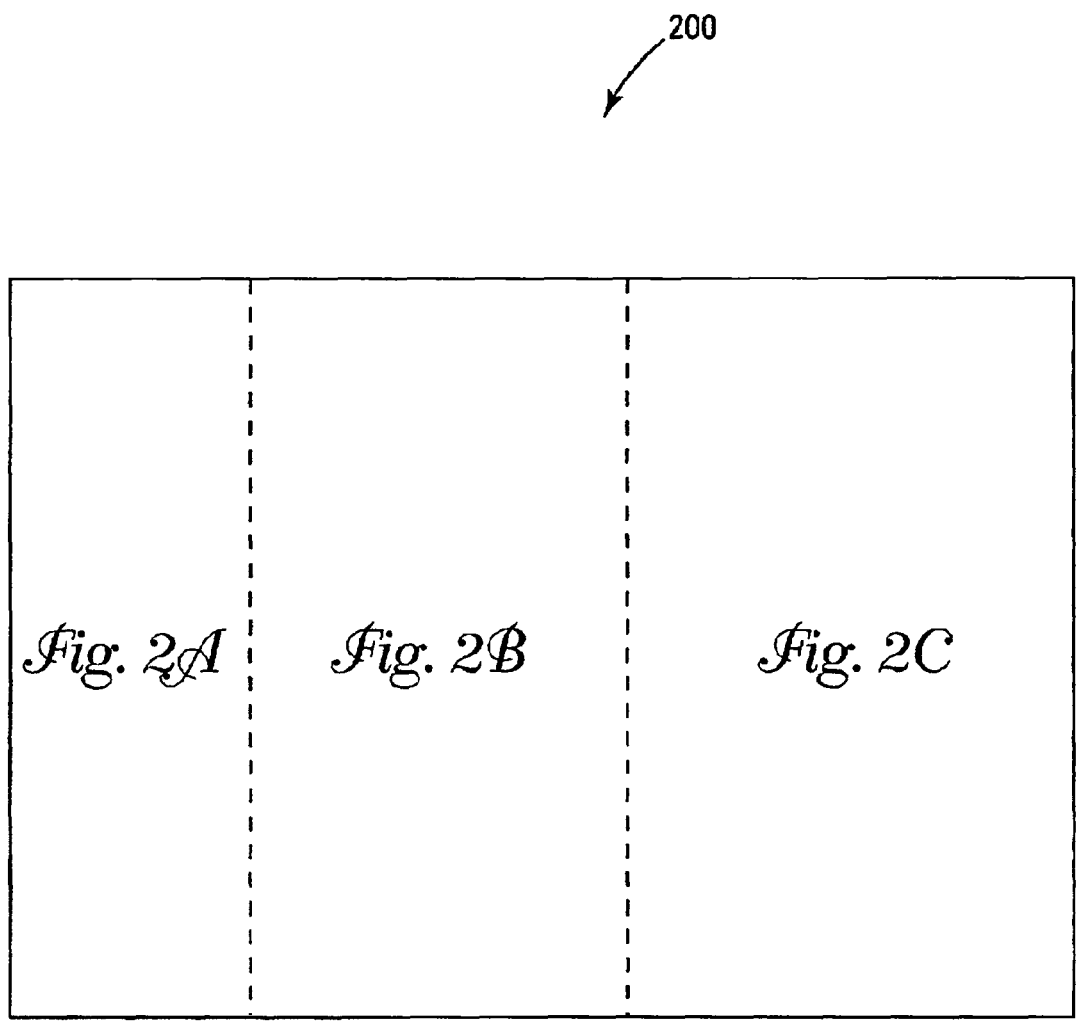
FIG. 2 is a simplified diagram of a regulator circuit embodiment of the present invention.
Figure 2A:
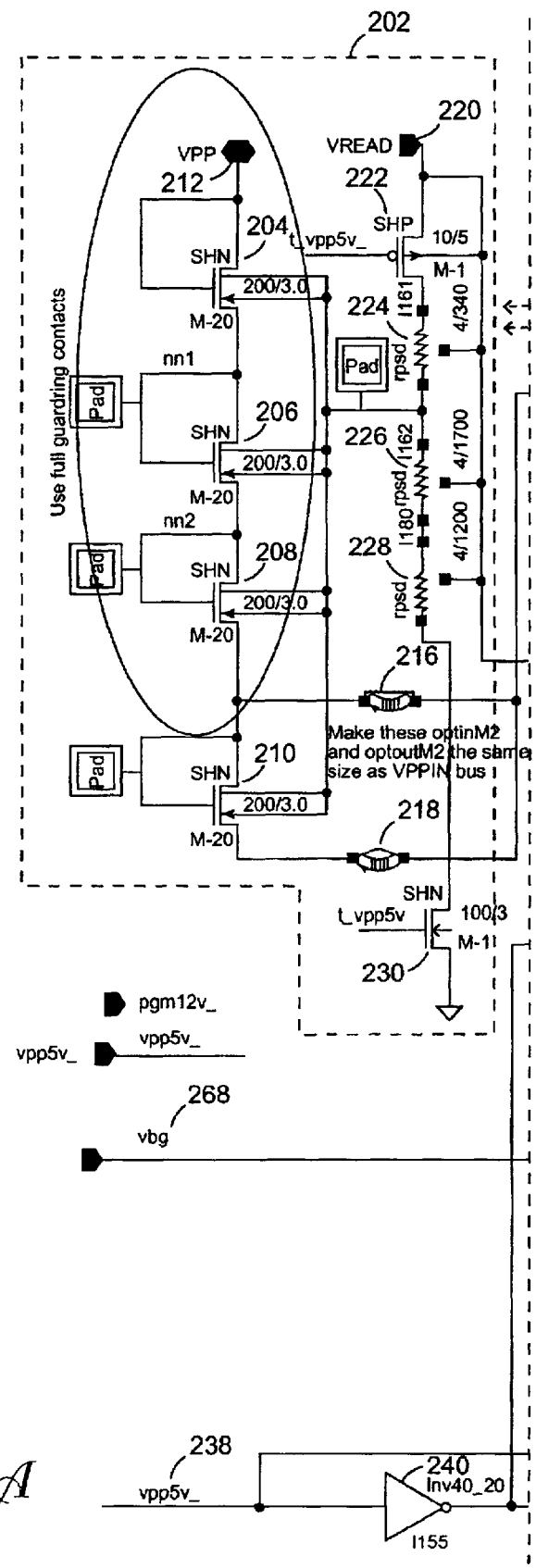
Figure 2B:
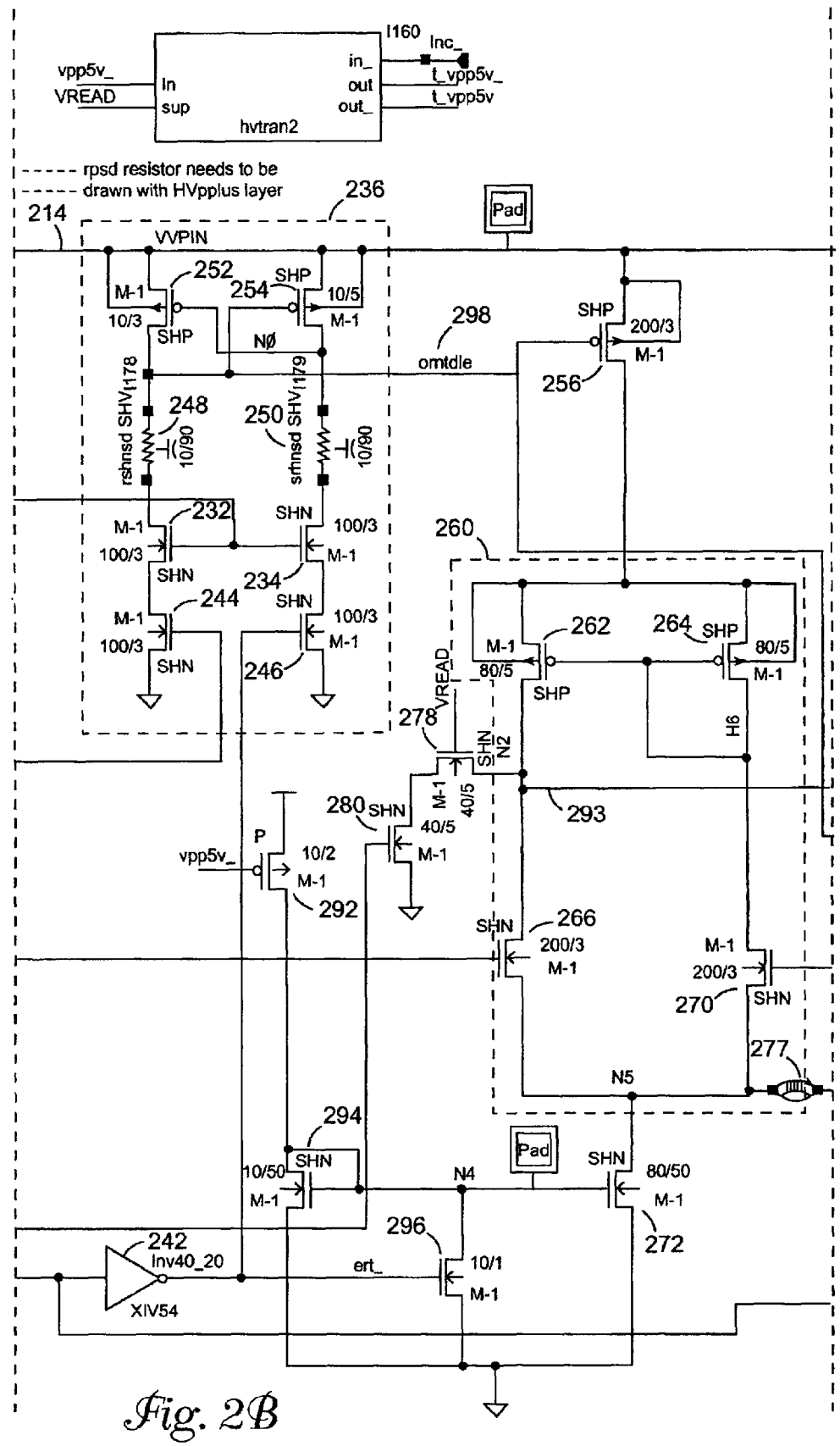
Figure 2C:
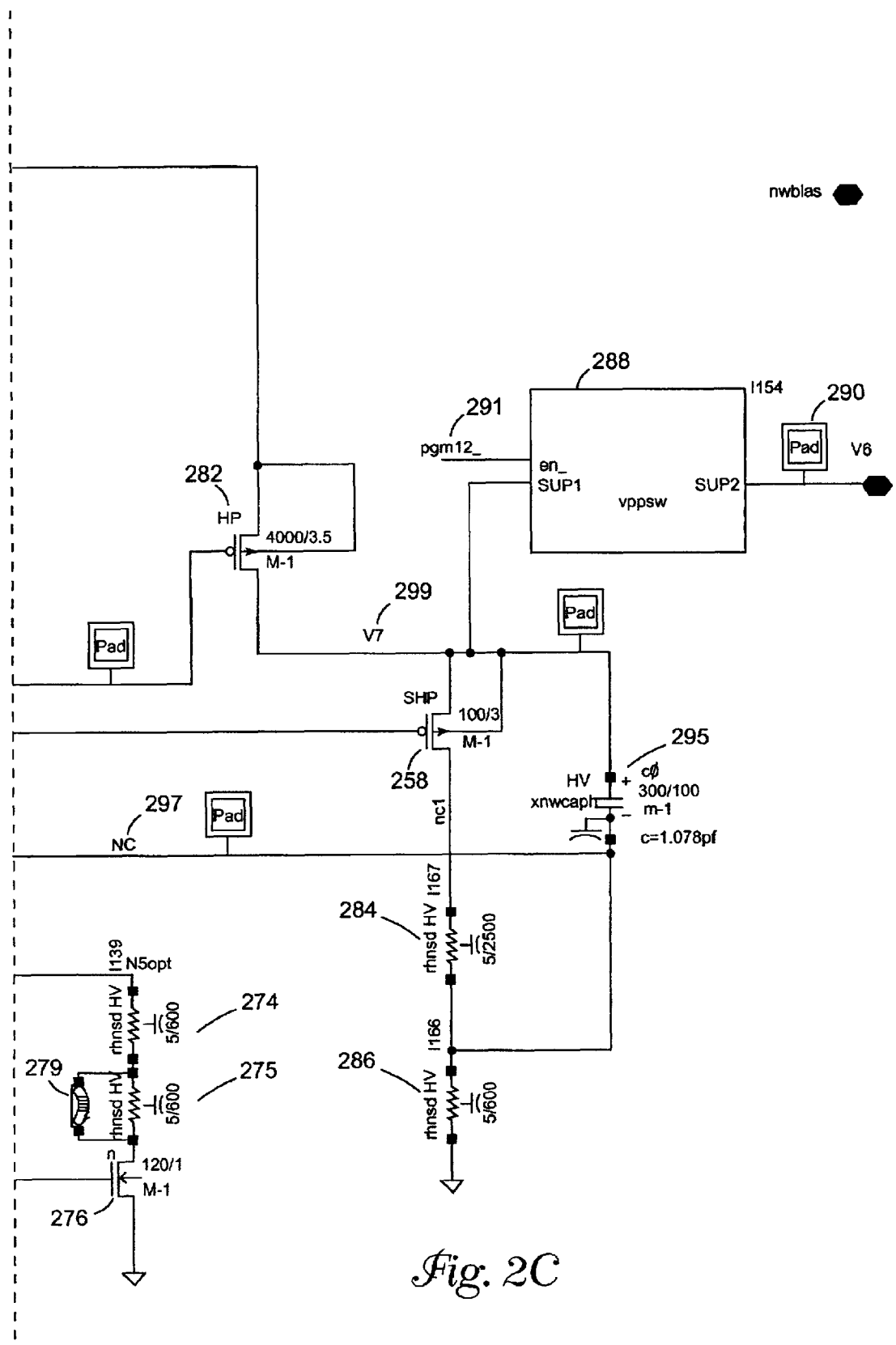

FIG. 2 is a simplified diagram of a voltage regulation circuit 200 that contains a voltage reduction circuit 202 which utilizes back bias voltage to allow it to accept higher input voltages than what the integrated circuit process limits allow. Additionally, the voltage regulation circuit 200 contains a level shifter circuit 236 to enable operation of the voltage regulation circuit 200, and a comparator circuit 260 to operate a regulating transistor 282 and control the voltage regulator circuit's output.

In the voltage reduction circuit 202 of FIG. 2, a sequence of serially coupled NMOS voltage reduction transistors 204, 206, 208, and 210 are formed in an isolation well (N-well) of the integrated circuit or memory containing the voltage regulation circuit 200. Each voltage reduction transistor 204, 206, 208, and 210 is diode coupled, with each transistor's gate coupled to its drain. The first transistor 204 in the series is coupled to the external high voltage input, Vpp 212, of 12V. In operation, voltage reduction transistors 204, 206, and 208 each drop a threshold voltage across itself and reduces the external input voltage of 12V to an output at circuit node Vppin 214 of 10V when in operation. Voltage reduction transistor 210 is optionally added to the voltage reduction circuit 202 to gain an additional threshold voltage drop on the external voltage input by disconnecting circuit link 216 and connecting circuit link 218. A back bias of 4V, which allows for the 2V required for an integrated process with a 10V limit to accept a 12 v input plus an additional 2 v margin for voltage spikes, is applied to the isolation N-well (and thus to the voltage reduction transistors 204, 206, 208, and 210) from the resistor bridge formed from resistors 224, 226, 228. The 4V of applied back bias allows an optimal gate/bulk voltage of 8V to be available for the transistors 204, 206, 208, and 210 of the voltage reduction circuit 202.

To supply the 4V of back bias a resistor bridge formed from resistors 224, 226, and 228 is coupled to voltage input Vread 220 via control of transistor 222 and to ground via transistor 230. Transistors 222 and 230 are turned on under the control of signal t_vpp5v, which is high when the external input voltage Vpp 212 is greater than 5V. The back bias voltage is coupled to the isolation well and voltage reduction transistors 204, 206, 208, and 210 from between resistors 224 and 226 of the resistor bridge. It is noted that the resistor bridge formed from resistors 224, 226, and 228 can be trimmed to provide differing amounts of back bias, allowing the voltage reduction circuit to be adjusted for differing voltage inputs.

In operation of the voltage regulator circuit 200, the level shifter circuit 236 enables the active operation of the voltage regulator circuit 200 by translating the signal vpp5v_238 (active low when Vpp 212 is greater than 5V) to higher voltage levels on node crntdis 298 to operate the circuits and transistors of the voltage regulator circuit 200 and enable its operation. The level shifter circuit 236 is enabled by voltage signal Vread 220 on transistors 232 and 234. The signal vpp5v_238 (active low) is coupled through inverters 240 and 242, which when vpp5v_238 is active, enable transistor 244 and disable transistor 246 of the level shifter circuit 236. With transistor 246 disabled, current flow through transistor 234, resistor 250 and (PMOS) transistor 254 from Vppin 214 is curtailed, raising the voltage on the gate of (PMOS) transistor 252 and disabling current flow from Vppin 214 through it. The enabled transistor 244 pulls current through enabled transistor 232 and resistor 248. As transistor 252 is disabled by the high voltage on its gate, the voltage on circuit node, crntdis 298, is pulled low. The low voltage on crntdis 298 enables (PMOS) transistor 254, further pulling the voltage on the gate of transistor 252 high and enforcing the level shift. The low voltage on crntdis 298 enables operation of the voltage regulator circuit 200 by enabling (PMOS) transistors 256 and 258.

When, vpp5v_238 is inactive and the voltage regulator circuit 200 disabled, transistor 244 is disabled and transistor 246 is enabled by operation of vpp5v_ through inverters 240 and 242. With transistor 246 enabled, current flows through transistor 234, resistor 250 and (PMOS) transistor 254 lowering the voltage on the gate of (PMOS) transistor 252 and enabling it. The disabled transistor 244 stops current flow through enabled transistor 232 and resistor 248. As transistor 252 is enabled by the low voltage on its gate, the voltage on circuit node, crntdis 298, is pulled high. The high voltage on crntdis 298 additionally disables (PMOS) transistor 254, further pulling the voltage on the gate of transistor 252 low and thus enforcing the level shift. The high voltage on crntdis 298 then disables operation of the voltage regulator circuit 200 by disabling operation of (PMOS) transistors 256 and 258.

The comparator circuit 260, when enabled by vpp5v_238 and crntdis 298, compares the output voltage V7 299 against a bandgap reference voltage Vbg 268 and from this controls the operation of the regulation transistor 282 to regulate output voltage V7 299. The comparator circuit 260 is enabled by current flowing through transistors 272 and 256. Voltage signal vpp5v_238, when active low, is level translated with transistors 292, 294 and 296 to drive the gate of transistor 272, turning it on and enabling current flow from the comparator circuit 260 to the lower power rail or ground. Vpp5v_238 through the level translator circuit 236 also drives the signal line crntdis 298 low. Crntdis 298 is coupled to the gate of (PMOS) transistor 256 and, when driven low, activates transistor 256 and enables current flow from Vppin 214 into the comparator circuit 260. Crndis 298 is also coupled to the gate of (PMOS) transistor 258 and, when active low, enables current flow through transistor 258 and the resistor bridge formed by resistors 284 and 286 to the lower power rail from the regulator output V7 299. A representative voltage signal NC 297 of the regulated output V7 299 is taken from between resistors 284 and 286 of the resistor bridge and coupled to the gate of transistor 270 of the comparator circuit 260. Voltage signal NC 297 is damped by the operation of capacitor 295 that is coupled between voltage signal NC 297 and the regulated output V7 299 to help smooth out noise. The bandgap voltage, Vbg 268, of 1.1 V is coupled from a band gap reference (not shown) to the gate of transistor 266 of the comparator circuit 260. The comparator circuit 260, when activated, compares the bandgap voltage, Vbg 268, to the representative output voltage signal NC 297. Current flows through the active comparator circuit 260 and is divided by a current mirror formed by PMOS transistors 262 and 264, where the gates of PMOS transistors 262 and 264 are coupled together and coupled to the drain of transistor 264. Transistor 264 thus operates in diode coupled mode by virtue of its gate being coupled to its drain. The coupled gates of PMOS transistors 262 and 264 are thus driven at the same potential and will therefore pass identical currents. The current flow from PMOS transistor 264 flows through transistor 270 and is modulated by the representative output voltage signal NC 297 that is coupled to the gate of transistor 270. Current flow from PMOS transistor 262 flows through transistor 266 and is modulated by the band gap voltage signal 268 that is coupled to the gate of transistor 266. Current then flows from transistors 270 and 266 to the lower power rail through transistor 272. Additional current from the comparator circuit 260 can be selectively sourced to the lower power rail through the use of optional transistor 276, resistors 275, 274, and links 277 and 279. As the current flow through transistor 270 and PMOS transistor 264 is modulated by the representative output voltage signal NC 297, the voltage drive to the gate of PMOS transistor 262 and thus the current flow through transistor 262 is varied. As the gate drive voltage, Vbg 268, on transistor 266 is held steady by the band gap voltage reference, the voltage level on node 293 between transistors 266 and 262 is varied. Node 293 is coupled to the gate of the voltage regulation transistor 282, and therefore voltage at the gate of voltage regulation transistor 282 is varied in response to the level of the output voltage, increasing and decreasing the drive as required to regulate output voltage V7 299 in response to demand.

The output voltage V7 299 is coupled to the final voltage output, V6 290, of the voltage regulation circuit 200 via high current switch 228 when enabled by signal pgm12v_291, active low. When the voltage regulation circuit 200 is not active, but voltage signal Vread 220 is present, circuit node 293 is clamped to the lower power rail via transistors 280 and 278.

It is noted that arrangements of multiple voltage reduction circuit isolation wells and back bias voltages are possible. It is also noted that other voltage regulation circuits 200, voltage reduction circuits 202, level shifter circuits 236, and comparators 260 utilizing embodiments of the present invention are possible and should be apparent to those skilled in the art with the benefit of the present disclosure.

Figure 3:
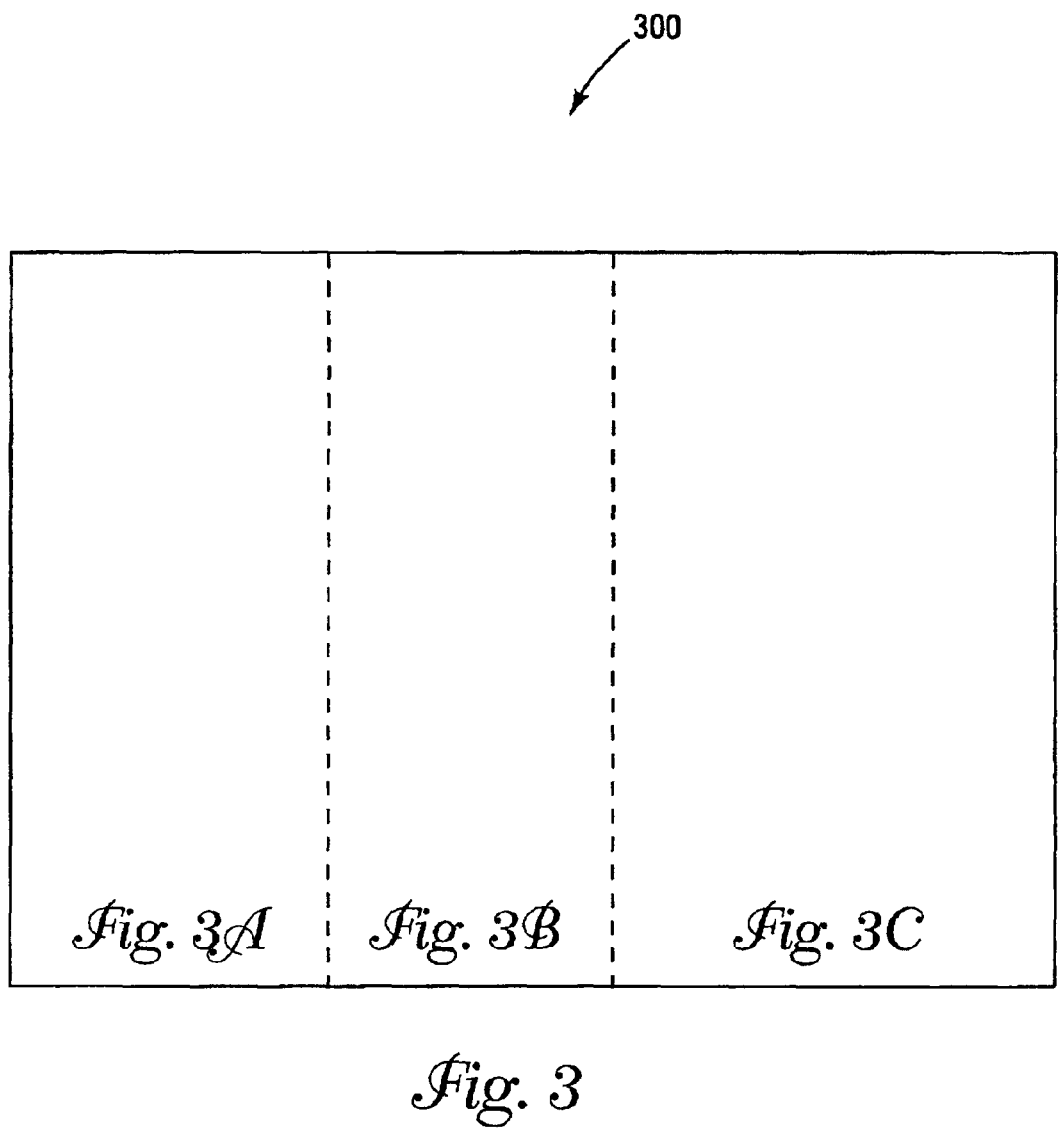
FIG. 3 is a simplified diagram of a back bias control circuit of an embodiment of the present invention.
Figure 3A:
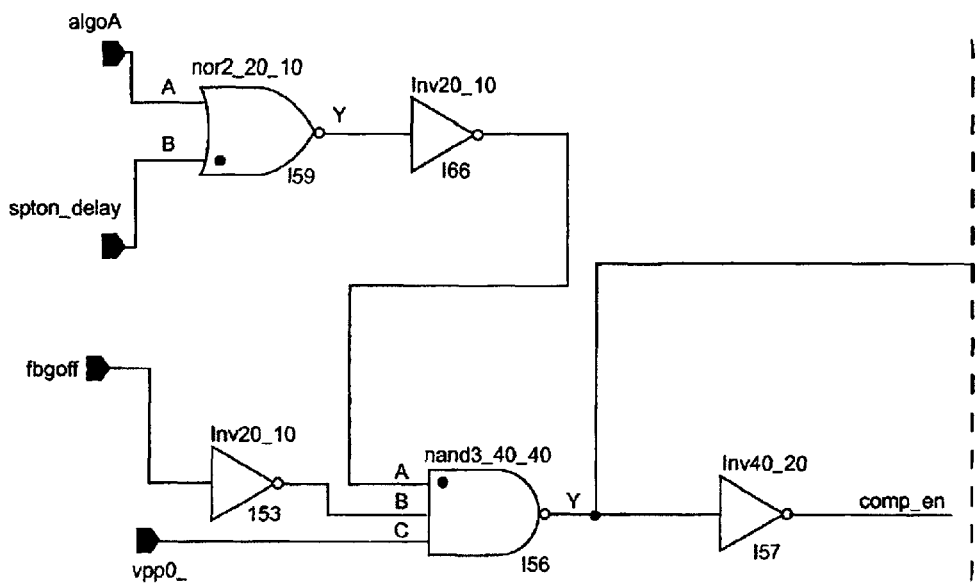
Figure 3A:
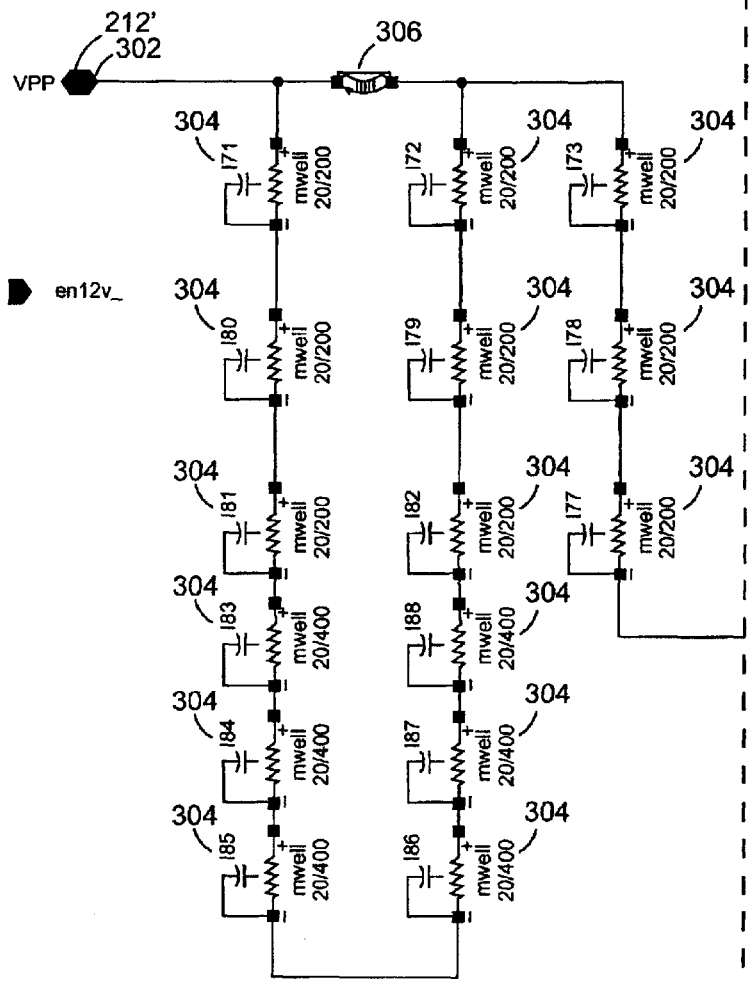
Figure 3B:
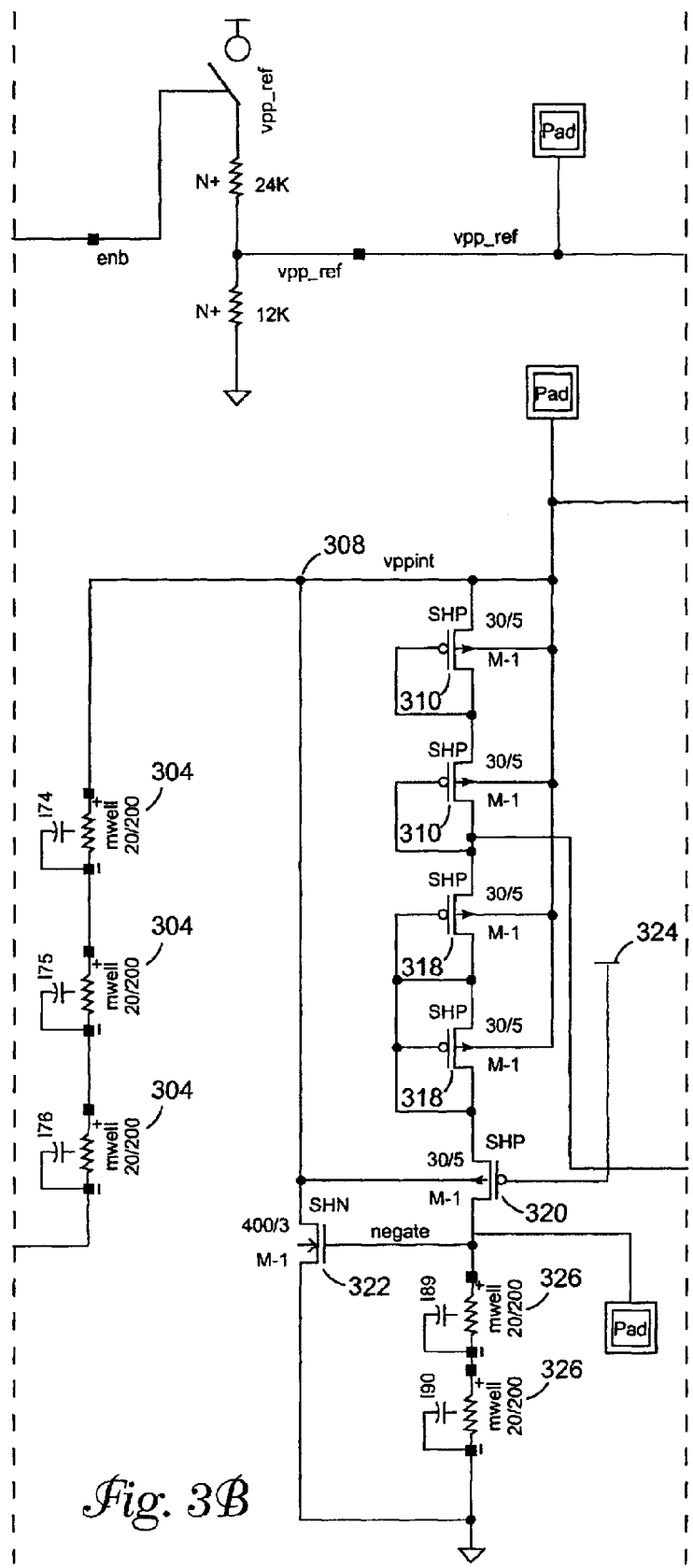
Figure 3C:
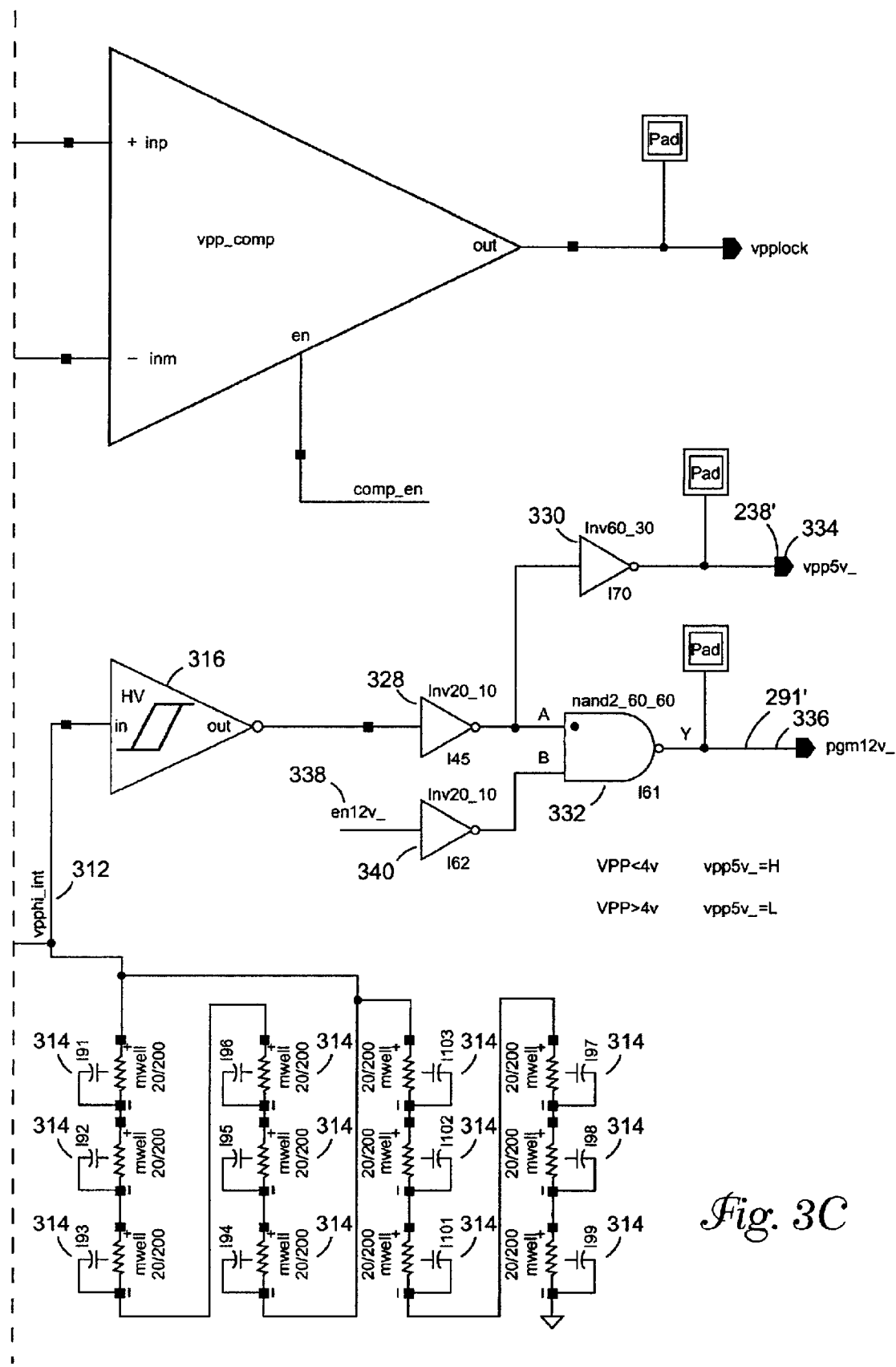

FIG. 3 is a simplified diagram of a back bias control circuit 300 of a voltage reduction circuit 202 embodiment of the present invention. In the back bias control circuit 300 of FIG. 3, the external voltage input Vpp 302, 212' is monitored by the back bias control circuit 300 and when the external voltage input Vpp 302, 212' passes a predetermined threshold level it is deemed "on" and of such a voltage potential that it is safe to turn on the back bias of the voltage reduction circuit 202 to allow it to be present before Vpp 302, 212' reaches 12V therefore avoiding damage to the 10V process input circuit by applying 12V without back bias being present. Additionally, the back bias control circuit 300 waits until Vpp 302, 212' passes a threshold level, typically 4V, to avoid the risk of inadvertently reverse biasing the PN diode junctions of the inherent bipolar transistor formed under the MOS transistor of the isolation wells that could happen if Vpp 302, 212' was still below the back bias potential or at ground.

In operation, the external voltage input Vpp 302, 212' is reduced by passage through a series of serially connected resistors 304 that are implemented in one or more isolation wells to reduce the voltage and place it within the integrated circuit process voltage limits at node Vppint 308. The number of resistances 304 can be adjusted to allow for smaller input voltages or to adjust the back bias circuit trigger point by use of the optional circuit link 306 to short across several of the resistors 304. The voltage at node 308 is dropped two threshold voltages by being coupled through the two diode coupled PMOS transistors 310 to node Vpphi_int 312. Vpphi_int 312 in turn is coupled to ground through a series of serially connected resistors 314 that are also implemented in one or more isolation wells. An inverting schmitt trigger 316 is coupled to node Vpphi_int 312 to detect when the external voltage input Vpp 302, 212' crosses 4V and filter out possible power rail noise or ripples that are present in the external voltage input Vpp 302, 212' as it is being powered up. The inverting schmitt trigger 316 utilizes hysteresis to filter the external voltage input Vpp 302, 212' and the output is coupled through inverters 328 and 330 to produce the back bias enable signal, Vpp5v_334, 238'. The output of inverter 328 in combination with the 12V enable signal, en12V_338, which coupled through inverter 340, is passed through NAND 332 and produces the enable signal pgm12v_336, 291' for the high current switch 288 of FIG. 2. When the integrated circuit is not in operation, Node Vpphi_int 312 and Vppint 308 are discharged. A low voltage on the power rail coupled to the gate of PMOS transistor 320 couples node Vpphi_int 312 to the lower power rail/ground through the two diode coupled transistors 318 coupled to the source of transistor 320 and a series of serially connected resistors 326 that are implemented in one or more isolation wells which are coupled to the drain of transistor 320. High voltage during discharge operation on the drain of transistor 320 is coupled to the gate of NMOS transistor 322 and turns it on, draining current from node Vppint 308.

It is noted that alternative voltage reduction circuits 202, voltage regulation circuits 200, and back bias control circuits 300 utilizing embodiments of the present invention are possible and should be apparent to those skilled in the art with the benefit of the present disclosure.

CONCLUSION

An improved voltage reduction circuit and method has been described that incorporates an independently controllable back bias voltage for increased gate/bulk fields in isolation well voltage reduction transistors that couple to and reduce external voltages that are too high for the integrated circuit process technology limits. The improved voltage reduction circuit and method allows for a higher overall available voltage and current flow for regulation by the circuit. Additionally, the improved voltage reduction circuit and method reduces voltage reduction circuit size by allowing for efficient implementation in a single isolation well. Furthermore, the improved voltage reduction circuit and method includes a back bias voltage control circuit that turns on and regulates the back bias voltage and avoids the problem of reverse bias conditions.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A voltage reduction circuit, comprising:
   an isolation well containing one or more serially coupled metal oxide semiconductor (MOS) transistors, wherein each MOS transistor has its gate coupled to its drain to operate in diode coupled mode and wherein a first MOS transistor of the one or more serially coupled MOS transistors is coupled to an external voltage input; and
   a back bias control circuit to apply a back bias voltage to the isolation well.

2. The voltage reduction circuit of claim 1, wherein the one or more serially coupled MOS transistors are PMOS transistors that are serially coupled drain to source.

3. The voltage reduction circuit of claim 1, wherein the one or more serially coupled MOS transistors are NMOS transistors that are serially coupled drain to source.

4. The voltage reduction circuit of claim 1, wherein the back bias control circuit is adapted to apply an optimal back bias voltage to the isolation well when the external voltage input reaches a predetermined threshold value.

5. The voltage reduction circuit of claim 4, wherein the back bias control circuit switches on at the external voltage input reaching 5V.

6. The voltage reduction circuit of claim 4, wherein the back bias control circuit applies 4V of back bias.

7. The voltage reduction circuit of claim 1, wherein the back bias control circuit further comprises:
   one or more serially coupled input resistors, wherein each input resistor is formed in an isolation well and wherein a first input resistor is coupled to the external voltage input;
   one or more serially coupled output resistors, wherein each output resistor is formed in an isolation well and a final output resistor is coupled to a lower power rail; and
   a schmitt trigger coupled to a final input resistor of the one or more serially coupled input resistors and to a first output resistor of the one or more serially coupled output resistors, wherein the schmitt trigger selectively enables and disables at a predetermined voltage threshold value of the external voltage input.

8. The voltage reduction circuit of claim 1, wherein the external voltage input is coupled to a 12V voltage signal.

9. The voltage reduction circuit of claim 1, wherein the voltage reduction circuit further comprises:
   a first transistor coupled to a supply voltage, a first resistor, and the back bias control circuit;
   a second transistor coupled to a lower power rail and the back bias control circuit; and
   a second resistor coupled to the second transistor and the first resistor, wherein the first and second resistors are coupled to the isolation well to apply a back bias voltage when the first and second transistors are enabled by the back bias control circuit.

10. A voltage regulator circuit, comprising:
    a voltage reduction circuit coupled to an external input;
    a back bias control circuit coupled to the voltage reduction circuit; and
    a voltage regulation circuit coupled to the voltage reduction circuit.

11. The voltage regulator circuit of claim 10, wherein the voltage reduction circuit further comprises:
    an isolation well containing one or more serially coupled metal oxide semiconductor (MOS) transistors, wherein each MOS transistor has its gate coupled to its drain to operate in diode coupled mode and wherein a first MOS transistor of the one or more serially coupled MOS transistors is coupled to the external input.

12. The voltage regulator circuit of claim 10, wherein the back bias control circuit further comprises:
    one or more serially coupled input resistors, wherein each input resistor is formed in an isolation well and wherein a first input resistor is coupled to the external input;
    one or more serially coupled output resistors, wherein each output resistor is formed in an isolation well and a final output resistor is coupled to a ground; and
    a schmitt trigger coupled to a final input resistor of the one or more serially coupled input resistors and to a first output resistor of the one or more serially coupled output resistors, wherein the schmitt trigger selectively activates back bias voltage applied to the voltage reduction circuit at a selected voltage threshold value of the external input.

13. The voltage regulator circuit of claim 10, wherein the voltage regulation circuit further comprises:
    a voltage input coupled to an output of the voltage reduction circuit;
    a regulation transistor coupled to the voltage input;
    a regulated voltage output coupled to the regulation transistor;
    a first resistor coupled to the regulated voltage output and second resistor coupled to a ground;
    a band gap voltage reference;
    a comparator circuit, wherein the comparator circuit is coupled to the band gap voltage reference and the first and second resistors, and wherein the comparator circuit varies a comparator circuit output that is coupled to a gate of the regulation transistor to regulate the regulated voltage output.

14. The voltage regulator circuit of claim 13, wherein the voltage regulation circuit further comprises:
    a voltage level shifter, wherein the voltage level shifter enables the voltage regulation circuit.

15. The voltage regulator circuit of claim 13, wherein the comparator circuit further comprises:
    a current mirror circuit, wherein the current mirror circuit has a first and second transistor, and wherein the gates of the first and second transistors are coupled to the drain of the first transistor;
    a third transistor, wherein a drain of the third transistor is coupled to the drain of the first transistor of the current mirror, and the gate of the third transistor is coupled to the first and second resistors; and
    a fourth transistor, wherein a drain of the fourth transistor is coupled to the drain of the second transistor of the current mirror and to the comparator circuit output, wherein the gate of the fourth transistor is coupled to the band gap voltage reference.

16. A back bias control circuit, comprising:
one or more serially coupled input resistors, wherein each input resistor is formed in an isolation well and wherein a first input resistor is coupled to an external voltage input;
one or more serially coupled output resistors, wherein, each output resistor is formed in an isolation well and a final output resistor is coupled to a lower power rail; and
a schmitt trigger coupled to a final input resistor of the one or more serially coupled input resistors and to a first output resistor of the one or more serially coupled output resistors, wherein the schmitt trigger selectively enables and disables at a predetermined voltage threshold value of the external voltage input.

17. The back bias control circuit of claim 16, further comprising:
one or more serially coupled MOS transistors with each MOS transistor having its gate coupled to its drain to operate in diode couple mode, wherein the one or more serially coupled MOS transistors are coupled between the final input resistor and the schmitt trigger.

18. The back bias control circuit of claim 16, wherein the input resistors are adjustable.

19. The back bias control circuit of claim 16, further comprising:
at least one discharge circuit, wherein the at least one discharge circuit is coupled to the final input resistor and the first output resistor and wherein the discharge circuit discharges a voltage at the final input resistor and the first output resistor.

20. A Flash memory device, comprising:
a memory array containing a plurality of floating gate memory cells;
an address interface coupled to a row address decoder and a column address decoder;
a control circuit coupled to the memory array and the address interface; and
a voltage regulator circuit, wherein the voltage regulator circuit is coupled an external voltage input and the memory array and is adapted to provide a programming current and a programming voltage when the Flash memory device operates in fast programming mode and wherein the voltage regulator circuit comprises:
a voltage reduction circuit;
a back bias control circuit; and
a voltage regulation circuit.

21. The Flash memory device of claim 20, wherein the voltage reduction circuit of the voltage regulator circuit further comprises:
an isolation well containing one or more serially coupled metal oxide semiconductor (MOS) transistors, wherein each MOS transistor has its gate coupled to its drain to operate in diode coupled mode and wherein a first MOS transistor of the one or more serially coupled MOS transistors is coupled to the external input.

22. The Flash memory device of claim 20, wherein the back bias control circuit of the voltage regulator circuit further comprises:
one or more serially coupled input resistors, wherein each input resistor is formed in an isolation well and wherein a first input resistor is coupled to the external input;
one or more serially coupled output resistors, wherein each output resistor is formed in an isolation well and a final output resistor is coupled to a ground; and
a schmitt trigger coupled to a final input resistor of the one or more serially coupled input resistors and to a first output resistor of the one or more serially coupled output resistors, wherein the schmitt trigger selectively activates back bias voltage applied to the voltage reduction circuit at a predetermined voltage threshold value of the external input.

23. The Flash memory device of claim 20, wherein the voltage regulation circuit of the voltage regulator circuit further comprises:
a voltage input coupled to an output of the voltage reduction circuit;
a regulation transistor coupled to the voltage input;
a regulated voltage output coupled to the regulation transistor;
a first resistor coupled to the regulated voltage output and second resistor coupled to a ground;
a band gap voltage reference;
a comparator circuit, wherein the comparator circuit is coupled to the band gap voltage reference and the first and second resistors, and wherein the comparator circuit varies a comparator circuit output that is coupled to a gate of the regulation transistor to regulate the regulated voltage output.

24. A system, comprising:
a processor; and
a Flash memory device coupled to the processor, wherein the Flash memory device comprises:
a memory array containing a plurality of floating gate memory cells;
an address interface coupled to a row address decoder and a column address decoder;
a control circuit coupled to the memory array and the address interface; and
a voltage regulator circuit, wherein the voltage regulator circuit is coupled an external voltage input and the memory array and is adapted to provide a programming current and a programming voltage when the Flash memory device operates in fast programming mode and wherein the voltage regulator circuit comprises:
a voltage reduction circuit;
a back bias control circuit; and
a voltage regulation circuit.

25. The system of claim 24, wherein the voltage reduction circuit further comprises:
an isolation well containing one or more serially coupled metal oxide semiconductor (MOS) transistors, wherein each MOS transistor has its gate coupled to its drain to operate in diode coupled mode and wherein a first MOS transistor of the one or more serially coupled MOS transistors is coupled to the external input.

26. The system of claim 24, wherein the back bias control circuit further comprises:
one or more serially coupled input resistors, wherein each input resistor is formed in an isolation well and wherein a first input resistor is coupled to the external input;
one or more serially coupled output resistors, wherein each output resistor is formed in an isolation well and a final output resistor is coupled to a ground; and
a schmitt trigger coupled to a final input resistor of the one or more serially coupled input resistors and to a first output resistor of the one or more serially coupled output resistors, wherein the schmitt trigger selectively activates back bias voltage applied to the voltage reduction circuit at a predetermined voltage threshold value of the external input.

27. The system of claim 24, wherein the voltage regulation circuit:

a voltage input coupled to an output of the voltage reduction circuit;

a regulation transistor coupled to the voltage input;

a regulated voltage output coupled to the regulation transistor;

a first resistor coupled to the regulated voltage output and second resistor coupled to a ground;

a band gap voltage reference;

a comparator circuit, wherein the comparator circuit is coupled to the band gap voltage reference and the first and second resistors, and wherein the comparator circuit varies a comparator circuit output that is coupled to a gate of the regulation transistor to regulate the regulated voltage output.

28. An integrated circuit, comprising:

a voltage reduction circuit coupled to an external input;

a back bias control circuit coupled to the voltage reduction circuit; and a voltage regulation circuit coupled to the voltage reduction circuit.

29. The integrated circuit of claim 28, wherein the voltage reduction circuit further comprises:

an isolation well containing one or more serially coupled metal oxide semiconductor (MOS) transistors, wherein each MOS transistor has its gate coupled to its drain to operate in diode coupled mode and wherein a first MOS transistor of the one or more serially coupled MOS transistors is coupled to the external input.

30. The integrated circuit of claim 28, wherein the back bias control circuit further comprises:

one or more serially coupled input resistors, wherein each input resistor is formed in an isolation well and wherein a first input resistor is coupled to the external input;

one or more serially coupled output resistors, wherein each output resistor is formed in an isolation well and a final output resistor is coupled to a ground; and a schmitt trigger coupled to a final input resistor of the one or more serially coupled input resistors and to a first output resistor of the one or more serially coupled output resistors, wherein the schmitt trigger selectively activates back bias voltage applied to the voltage reduction circuit at a predetermined voltage threshold value of the external input.

31. The integrated circuit of claim 28, wherein the voltage regulation circuit further comprises:

a voltage input coupled to an output of the voltage reduction circuit;

a regulation transistor coupled to the voltage input;

a regulated voltage output coupled to the regulation transistor;

a first resistor coupled to the regulated voltage output and second resistor coupled to a ground;

a band gap voltage reference;

a comparator circuit, wherein the comparator circuit is coupled to the band gap voltage reference and the first and second resistors, and wherein the comparator circuit varies a comparator circuit output that is coupled to a gate of the regulation transistor to regulate the regulated voltage output.

32. A method of operating a voltage reduction circuit, comprising:

receiving an external voltage at an integrated circuit;

applying an optimal back bias voltage to a voltage reduction circuit that is formed in an isolation well when the external voltage reaches a predetermined threshold value; and reducing the external voltage with the voltage reduction circuit.

33. The method of claim 32, wherein the optimal back bias voltage is 4V.

34. The method of claim 32, wherein the received external voltage is 12V.

35. The method of claim 32, wherein the threshold value for the external voltage is 5V.

36. The method of claim 32, further comprising:

removing the back bias voltage to the voltage reduction circuit when the external voltage reaches a predetermined threshold value.

37. The method of claim 36, wherein the optimal back bias voltage is 4V.

38. The method of claim 32, wherein applying an optimal back bias voltage to a voltage reduction circuit further comprises applying an optimal back bias voltage to a voltage reduction circuit as determined by an integrated circuit process technology limit plus a margin for voltage spikes.

39. The method of claim 32, wherein the integrated circuit process technology limit is 10V and the margin for voltage spikes is 2V.

* * * * *